United States Patent
Cheng et al.

(10) Patent No.: US 9,522,822 B2
(45) Date of Patent: Dec. 20, 2016

(54) SENSOR INTEGRATION WITH AN OUTGASSING BARRIER AND A STABLE ELECTRICAL SIGNAL PATH

(71) Applicant: Taiwan Semiconductor Manufacturing Co., Ltd., Hsin-Chu (TW)

(72) Inventors: Chun-Wen Cheng, Zhubei (TW); Chia-Hua Chu, Zhubei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 92 days.

(21) Appl. No.: 14/276,445

(22) Filed: May 13, 2014

(65) Prior Publication Data

US 2015/0329353 A1    Nov. 19, 2015

(51) Int. Cl.
| | | |
|---|---|---|
| *B81C 1/00* | (2006.01) | |
| *B81B 7/00* | (2006.01) | |
| *H01L 23/02* | (2006.01) | |
| *H01L 23/00* | (2006.01) | |
| *H01L 25/16* | (2006.01) | |

(52) U.S. Cl.
CPC .......... *B81C 1/0023* (2013.01); *B81B 7/0041* (2013.01); *B81B 7/0077* (2013.01); *B81C 1/00269* (2013.01); *B81B 2207/012* (2013.01); *H01L 23/02* (2013.01); *H01L 24/02* (2013.01); *H01L 25/16* (2013.01)

(58) Field of Classification Search
None
See application file for complete search history.

(56) References Cited

U.S. PATENT DOCUMENTS

| | | | |
|---|---|---|---|
| 6,372,619 B1 | 4/2002 | Huang et al. | |
| 6,936,918 B2 * | 8/2005 | Harney | B81B 7/007 257/704 |
| 7,030,494 B2 * | 4/2006 | Aoki | H01L 23/5389 257/415 |
| 7,659,150 B1 | 2/2010 | Monadgemi et al. | |
| 8,497,557 B2 | 7/2013 | Tanaka et al. | |
| 8,507,358 B2 * | 8/2013 | Chou | B81C 1/00246 257/503 |
| 8,525,278 B2 | 9/2013 | Chu | |
| 8,587,077 B2 * | 11/2013 | Chen | B81C 1/00238 257/254 |
| 8,647,963 B2 | 2/2014 | Lee et al. | |
| 8,716,051 B2 | 5/2014 | Lin et al. | |

(Continued)

OTHER PUBLICATIONS

Fan, et al. "Low Temperature Wafer-Level Metal Thermo-Compression Bonding Technology for 3D Integration." InTech, published in 2012.

(Continued)

*Primary Examiner* — Andres Munoz
(74) *Attorney, Agent, or Firm* — Eschweiler & Associates, LLC

(57) ABSTRACT

The present disclosure relates to a structure and method of forming a MEMS-CMOS integrated circuit with an outgassing barrier and a stable electrical signal path. An additional poly or metal layer is embedded within the MEMS die to prevent outgassing from the CMOS die. Patterned conductors formed by a damascene process and a direct bonding between the two dies provide a stable electrical signal path.

19 Claims, 14 Drawing Sheets

(56) References Cited

U.S. PATENT DOCUMENTS

| | | | |
|---|---|---|---|
| 8,716,852 B2 | 5/2014 | Shu et al. | |
| 8,729,646 B2* | 5/2014 | Chu | B81B 3/0059 |
| | | | 257/415 |
| 8,866,238 B2* | 10/2014 | Classen | B81C 1/00246 |
| | | | 257/226 |
| 9,227,841 B2* | 1/2016 | Huang | B81B 7/0064 |
| 2005/0250253 A1 | 11/2005 | Cheung | |
| 2009/0108381 A1* | 4/2009 | Buchwalter | B81C 1/0023 |
| | | | 257/415 |
| 2010/0006959 A1* | 1/2010 | Kim | B81C 1/00301 |
| | | | 257/415 |
| 2010/0273286 A1 | 10/2010 | Liang | |
| 2012/0025389 A1* | 2/2012 | Chu | B81C 1/00269 |
| | | | 257/773 |
| 2012/0098074 A1 | 4/2012 | Lin et al. | |
| 2012/0125747 A1 | 5/2012 | Chu et al. | |
| 2012/0248615 A1* | 10/2012 | Chien | B81C 1/0023 |
| | | | 257/770 |
| 2013/0043510 A1 | 2/2013 | Shu et al. | |
| 2013/0093084 A1 | 4/2013 | Chen et al. | |
| 2013/0105923 A1 | 5/2013 | Yu et al. | |
| 2013/0127036 A1* | 5/2013 | Kuo | B81B 3/001 |
| | | | 257/704 |
| 2013/0213139 A1 | 8/2013 | Chen | |
| 2013/0214400 A1 | 8/2013 | Shu et al. | |
| 2013/0277777 A1* | 10/2013 | Chang | B81B 7/00 |
| | | | 257/418 |
| 2014/0042562 A1 | 2/2014 | Chu et al. | |
| 2014/0117475 A1* | 5/2014 | Classen | B81C 1/00246 |
| | | | 257/418 |
| 2014/0203421 A1 | 7/2014 | Shu et al. | |
| 2015/0035089 A1* | 2/2015 | Liu | B81B 7/02 |
| | | | 257/415 |
| 2015/0175406 A1* | 6/2015 | Lin | B81B 7/007 |
| | | | 257/415 |
| 2015/0175407 A1* | 6/2015 | Cheng | B81C 1/00246 |
| | | | 257/415 |
| 2015/0197419 A1* | 7/2015 | Cheng | B81B 7/0006 |
| | | | 257/418 |
| 2015/0329351 A1* | 11/2015 | Cheng | B81B 7/007 |
| | | | 257/417 |

OTHER PUBLICATIONS

Lu, et al. "Mechanisms Underlying the Unstable Contact Resistance of Conductive Adhesives." IEEE Transactions on Electronics Pacjaging Manufacturing, vol. 22, No. 3, Jul. 1999.

Fukuta, et al. "Vapor Hydrofluoric Acid (HF) Sacrificial Release Technique for MEMS Using Labware." Japanese Journal of Applied Physics. Jan. 2003.

U.S. Appl. No. 14/472,636, filed Aug. 29, 2014.

U.S. Appl. No. 14/645,650, filed Mar. 12, 2015.

U.S. Appl. No. 14/225,733, filed with the USPTO on Mar. 26, 2014.

Non Final Office Action Dated Jan. 12, 2016 U.S. Appl. No. 14/472,636.

Final Office Action dated Jun. 22, 2016 for U.S. Appl. No. 14/472,636.

Notice of Allowance Dated Oct. 3, 2016, U.S. Appl. No. 14/472,636.

* cited by examiner

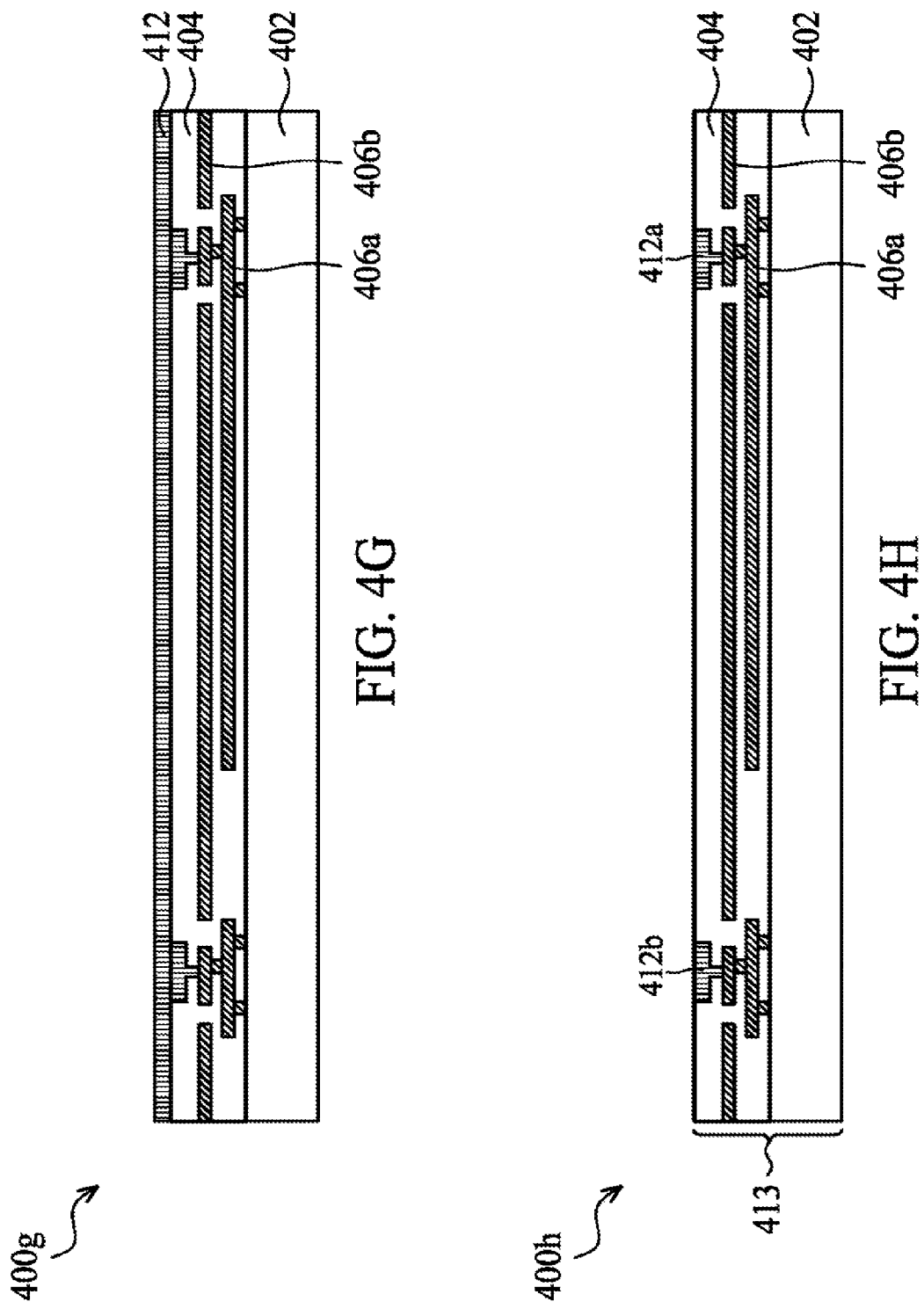

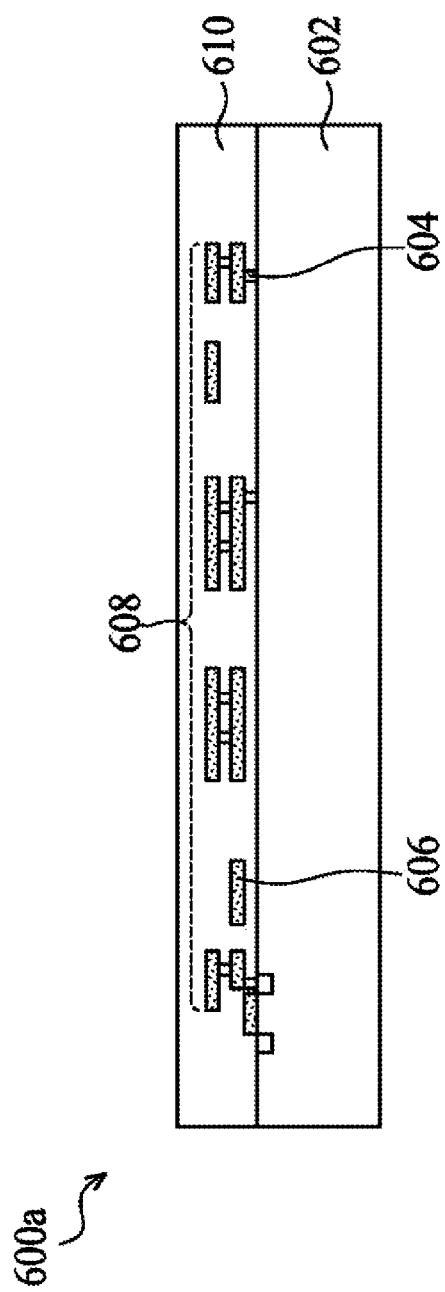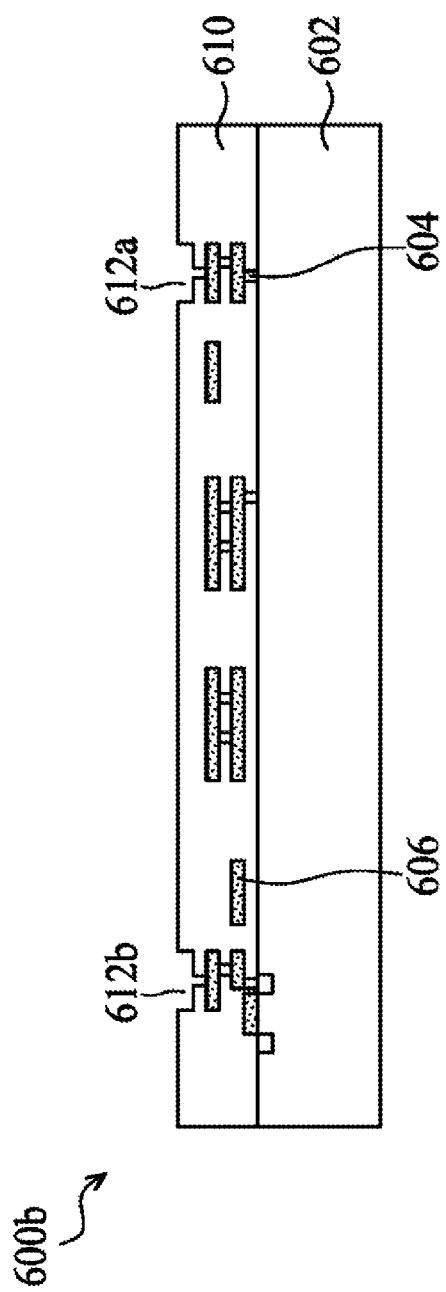

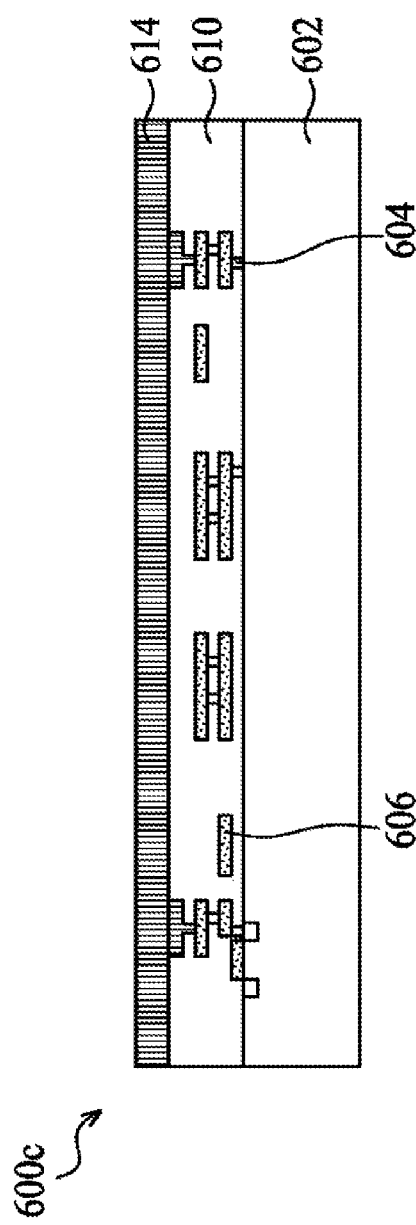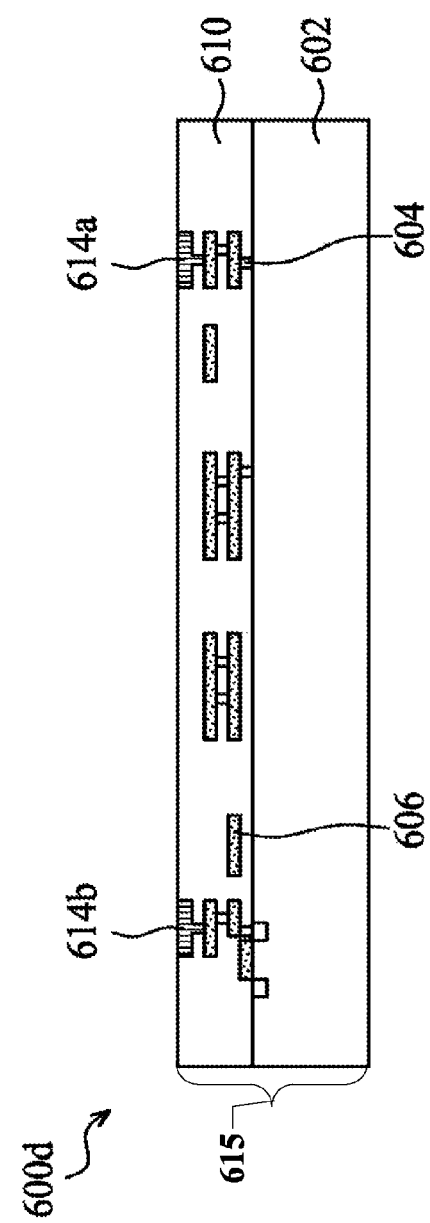

SENSOR INTEGRATION WITH AN OUTGASSING BARRIER AND A STABLE ELECTRICAL SIGNAL PATH

BACKGROUND

MEMS (micro-electromechanical system) devices, such as accelerometers, pressure sensors, gyroscopes, etc., have found widespread using in many modern day electronic devices. For example, MEMS accelerometers are commonly found in automobiles (e.g., in airbag deployment systems), tablet computers, or in smart phones In recent years, it is increasingly common for MEMS to be incorporated into integrated chips formed by a complementary metal-oxide-semiconductor (CMOS) process. The incorporation of MEMS (e.g., sensors, integrated optics, biochips, etc.) into a CMOS process allows for widespread use of MEMS fabricated with a high throughput.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4H illustrate embodiments of cross sectional images of a method of formation of a MEMS wafer according to the present disclosure.

FIGS. 6A-6D illustrate embodiments of cross sectional images of a method of formation of a CMOS wafer according to the present disclosure.

DETAILED DESCRIPTION

Figure 1A:
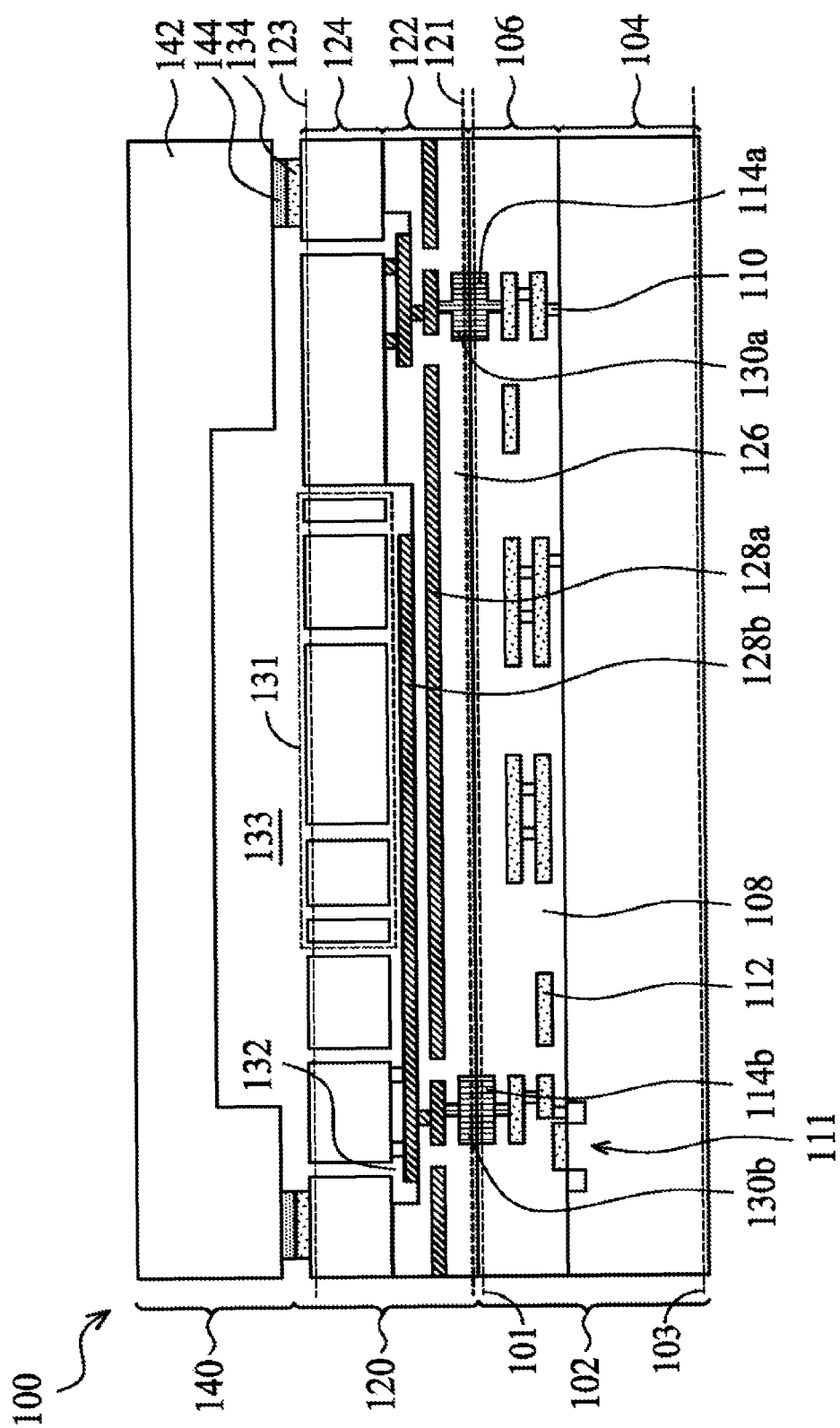
FIG. 1A illustrates a cross sectional view of an integrated circuit (IC) comprising an outgas barrier layer, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Microelectromechanical systems (MEMS) devices are very small electro-mechanical systems often incorporated into integrated circuit devices. The integration may provide for lower parasitics (e.g., resistance, inductance, and capacitance), lower cost, and/or increased performance. MEMS devices are used in a variety of applications, such as in sensors for motion controllers, inkjet printers, airbags, microphones, and gyroscopes, as examples. The fabrication and development of MEMS devices has experienced numerous challenges including those of integrating the MEMS chips and integrated circuit chips together. In traditional process flows, a MEMS and an IC chip may be placed side-by-side and then wire bonded together. This however is time consuming and can provide a product with a large footprint. Wafer-level chip scale packaging of MEMS and CMOS devices is advantageous in that it can reduce packaging and integration costs. A suitable bonding technique provides an electrical and/or mechanical connection between the MEMS and circuit substrates.

MEMS sensor devices often operate by sensing a characteristic of an environment surrounding the device. For example, to measure an angular acceleration, a MEMS vibrational gyroscope may utilize the Coriolis effect. Based on this measured angular acceleration, the MEMS vibrational gyroscope can determine velocity, position, and the like, or can trigger an event, such as deployment of an airbag, for example. To improve operation of a MEMS device, it may be desirable to operate at a specific pressure that enables improved measurement of a desired parameter. For example, in the case of a MEMS vibrational gyroscope, a lower pressure (i.e., a higher vacuum) provides for a better measurement since it mitigates background noise. Therefore, MEMS devices typically have a hermetically-sealed cavity that is held at a controlled pressure level (e.g., vacuum) that enables operation of the device. However, one of the major problems that can hinder the operation of such devices is outgassing. Outgassing is the release of a gas that was dissolved, trapped, frozen or absorbed in some material. Outgassing from layers formed on the CMOS devices or from the bonding die can degrade the controlled pressure level (e.g., vacuum) environment provided for the MEMS devices.

Accordingly, the present disclosure relates to a new processing method and structure for a MEMS-CMOS integrated circuit, that includes an outgas barrier structure. An additional poly or metal layer is formed within the MEMS die which acts as an electrical shield and outgas sing block between the MEMS and CMOS dies. A MEMS-last or post-CMOS integration technique is utilized, where the metallization fabrication and formation of poly-silicon mircrostructures are completed separately on the CMOS and MEMS wafers respectively, after which, the MEMS wafer is flipped and disposed on top of the CMOS wafer. Patterning the MEMS wafer and sealing the MEMS wafer with a cap wafer follows. The cap wafer bonds to the back surface of the MEMS wafer, defining a sealed cavity which is held at a controlled pressure level. The outgas barrier layer prevents outgassing and helps maintain the pressure level of the sealed cavity.

Another problem associated with such integrated circuits is the lack of a stable electrical path. Conventional MEMS-CMOS integrated circuits use eutectic bonds to form a seal and an electrical connection between CMOS and MEMS dies. Eutectic bonding is a metal based bonding technology which stacks two dies by intermediate eutectic compounds formation. However eutectic bonding process is expensive and it can give rise to unstable contact resistance. Since a high temperature and high pressure condition is required to form an alloy or eutectic compound, a slight change in the reaction condition can vary the contact resistance by many folds. The present disclosure utilizes a direct bonding technique for coupling the two dies. This bonding process is based on chemical bonds between two surfaces of any materials with sufficiently clean, flat and smooth surfaces. The procedural steps of the direct bonding process of dies at any surface comprise die preprocessing, pre-bonding at room temperature and annealing at elevated temperatures.

FIG. 1A illustrates a cross sectional view of an integrated circuit (IC) comprising an outgas barrier layer, according to some embodiments of the present disclosure. IC 100 comprises a CMOS die 102, a MEMS die 120 disposed above the CMOS die 102, and a cap 140 disposed above the MEMS die 120. When the cap 140 is bonded to the MEMS die 120, a cavity 133 is formed. This cavity 133 is hermetically sealed by bonding materials 134, 144, such that the cavity 133 can have a pressure that is different from that of the ambient environment surrounding the IC 100. For example, the cavity 133 can be kept at a low pressure to aid operation of MEMS devices on the MEMS die 120. In particular, as will be appreciated in greater detail below, outgas barrier layer 128a helps to prevent or limit gases from outgassing or diffusing from the CMOS die 102 into the cavity 133, thereby promoting more reliable MEMS operation.

CMOS die 102 comprises a CMOS substrate 104 and a CMOS interconnect 106 to couple devices, such as device 111, to one another on CMOS substrate 104. CMOS die 102 comprises a planar top surface 101 and a bottom surface 103. In some embodiments, the CMOS substrate 104 comprises silicon (Si). However, the CMOS substrate 104 in more general terms may be a bulk semiconductor (e.g., silicon) die, a binary compound substrate (e.g., a GaAs die), a ternary compound substrate (e.g., AlGaAs), or higher order compound dies, among others. Further, CMOS substrate can also include non-semiconductor materials such as oxide in silicon-on-insulator (SOI), partial SOI substrate, polysilicon, amorphous silicon, or organic materials, among others. In some embodiments, the CMOS substrate can also include multiple dies or dies which are stacked or otherwise adhered together. The CMOS substrate can include dies which are cut from a silicon ingot, and/or any other type of semiconductor/non-semiconductor and/or deposited or grown (e.g., epitaxial) layers formed on an underlying substrate. A first dielectric layer 108, such as an oxide, forms the base material of the CMOS interconnect 106, and has a planar top surface. In some embodiments the first dielectric 108 acts as a source of outgas sing. The CMOS interconnect 106 has different metallization layers 112 and contact vias 110 that connect them. In some embodiments, the metallization layers 112 comprise AlCu (Aluminum Copper) and the contact vias 110 comprise W (Tungsten). Two patterned interconnects 114a and 114b are disposed at two end locations of the CMOS interconnect 106, and top surfaces of these interconnects 114a and 114b are coplanar with the top surface of the first oxide layer 108. In some embodiments, the patterned interconnects 114a and 114b comprise Cu.

MEMS die 120 comprises a MEMS substrate 124 and a MEMS interconnect 122 which is electrically connected to the CMOS interconnect 106. A planar top surface of the MEMS die 120 is represented by reference numeral 121 and a bottom surface by reference numeral 123. The MEMS interconnect 122 comprises a second oxide layer 126, an outgas barrier layer 128a, and an electrode layer 128b disposed therein. In some embodiments, the outgas barrier layer 128a and the electrode layer 128b comprise poly silicon or any suitable metal. The MEMS die 120 is flipped and disposed above the CMOS die 102 such that, top surface of the second oxide layer 126 is in contact with the top surface of the first oxide layer 108. The MEMS substrate 124 includes a proof mass 131, which is a known quantity of mass used in a measuring instrument as a reference for the measurement of an unknown quantity. The MEMS die 120 further has sacrificial openings 132, which are formed as part of release structures formed by VHF (vapor hydrofluoric acid) etching. VHF etching is used for the fabrication of movable microstructures in MEMS devices with minimal or no stiction issue (stiction issue arises when moving parts of MEMS device seize up under forces of sticking and friction, which is usually associated with wet etching processes). These sacrificial openings, represented by reference numeral 132, are in contact with the electrode layer 128b and the second oxide layer 126. Two patterned interconnects 130a and 130b are disposed at two end locations of the MEMS interconnect 122, and top surfaces of these interconnects 130a and 130b are coplanar with the top surface of the second oxide layer 126. Also, the interconnect 114a is in contact with the interconnect 130a and the interconnect 114b is in contact with the interconnect 130b. In some embodiments, the patterned interconnects 130a and 130b comprises Cu. The MEMS substrate 124 has bond material 134 on its back surface for bonding with the cap 140.

Cap 140 is bonded with the MEMS die 120 through bonding material 144 disposed on the surface of the cap 140, which couples with bonding material 134 on the MEMS die 120 creating a hermetically sealed cavity 133. In some embodiments, the pressure level of the cavity 133 ranges between approximately 0.1 Torr and 10 Torr. The bond between the bonding materials 134 and 144 can be a eutectic bond or a fusion bond. In some embodiments, bonding material 134 comprises AlCu or Au, and bonding material 144 comprises Ge (Germanium) or Au. A base layer of the cap is represented by reference numeral 142 and in some embodiments, it comprises Si.

Figure 1B:
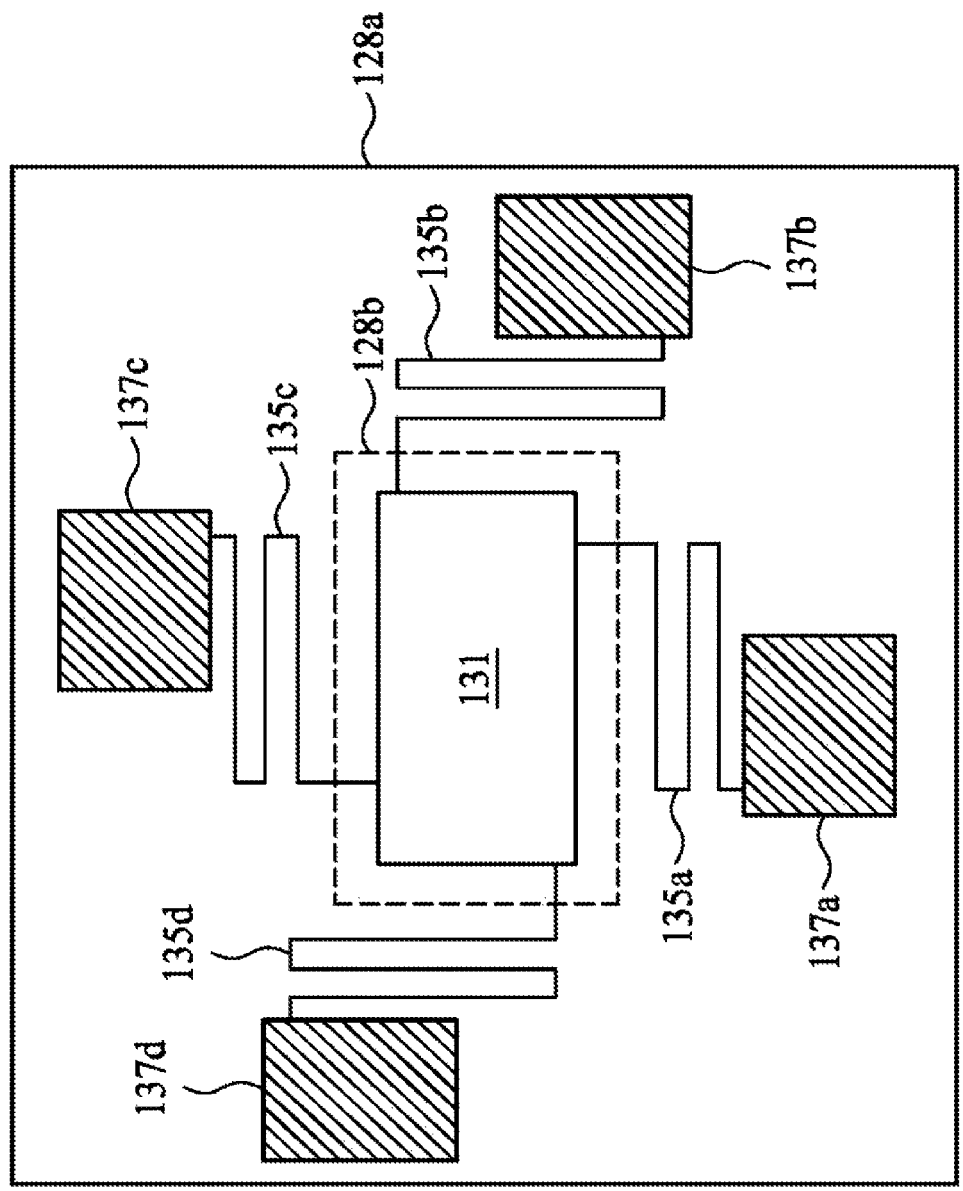
FIG. 1B illustrates a top view image of the IC in FIG. 1A.

FIG. 1B illustrates a top view image 100a of the IC in FIG. 1A. This image illustrates the coverage area of the outgas barrier layer 128a with respect to the electrode poly layer 128b. The electrode poly layer 128b extends under the area of the proof mass 131. The proof mass 131 is connected to four anchors 137a-137d through four springs 135a-135d. The anchors and the springs are supporting elements used for making measurements in a MEMS sensor (usually in a MEMS vibrational gyroscope). The outgas barrier layer 128a resides under these elements and extends over an area large enough to cover/protect these elements from outgas sing, from the CMOS die underneath. In some embodiments, the area of the outgas barrier layer 128a ranges from approximately 10 um$^2$ to 10 mm$^2$.

The outgas barrier layer 128a acts as an outgassing block as well as an electrical shield for the MEMS die 120, by protecting it from the devices and/or die underneath (outgassing of oxygen from the first oxide layer 108 in this case). The planar top surface and chemically mechanically polished patterned conductors on both the MEMS die 120 and the CMOS die 102 facilitates a direct bonding or hybrid bonding between the two dies 120 and 102, and this provides a stable electrical path between them. For forming patterned conductors, a 'copper (Cu) damascene' process is utilized. In this process, the underlying insulating layer (silicon oxide) is patterned with open trenches where the conductor should be. A thick coating of copper that significantly overfills the trenches is deposited on the insulator, and chemical-mechanical planarization (CMP) is used to remove the copper (known as overburden) that extends above the top of the insulating layer. Copper sunken within the trenches of the insulating layer is not removed and becomes the patterned conductor.

During operation, the proof mass 131 is maintained over an internal surface (MEMS surface) and spaced, i.e. suspended, above the surface of the MEMS interconnect 122. The proof mass 131 is coupled to the surface by the anchors 137a-137d and is disposed over a sensing and driving electrode, i.e., poly electrode 128b formed in or on the surface. When the IC is moved (i.e., accelerated), the proof mass 131 tends to stay at rest, and therefore, there is a small displacement between the proof mass 131 and the surrounding MEMS and CMOS structures on the IC, including the poly electrode 128b, caused by the springs 135 "stretching" or "twisting". When the proof mass 131 deflects responsive to the applied force, the proof mass 131 changes position relative to the sensing electrode 128b, and a change in capacitance can be measured to determine the extent of deflection (and corresponding applied force). Because the capacitance between the proof mass 131 and the fixed sensing electrode 128b depends upon the dielectric between them, which can change over time if outgassing occurs, and because the amount of deflection for the proof mass 131 for a given force can be impacted by air damping effects or outgas sing effects; it is important to limit outgas sing to help ensure the MEMS sensor retains the same sensing characteristics over time. Thus, the advent of outgassing layer 128a improves the precision of the sensor over its lifetime.

Figure 2:
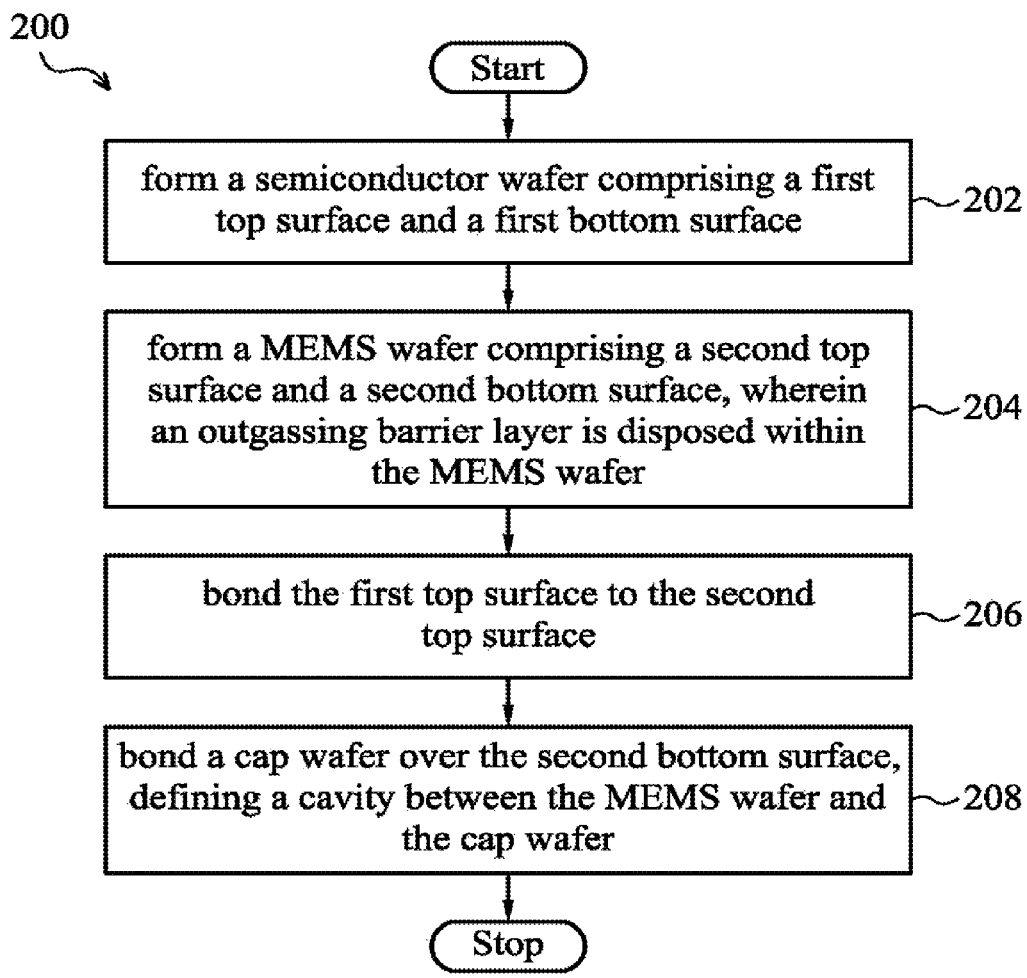
FIG. 2 illustrates a flow diagram of some embodiments of a method for forming an integrated circuit according to the present disclosure.

FIG. 2 illustrates a flow diagram of some embodiments of a method 200 for forming an integrated circuit according to the present disclosure. While disclosed method 200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 202, a semiconductor wafer comprising a first top surface and a first bottom surface is formed.

At 204, a MEMS wafer comprising a second top surface and a second bottom surface is formed. The MEMS wafer includes an outgas barrier layer.

At 206, the first top surface is bonded to the second top surface.

At 208, a cap wafer is bonded over the second bottom surface to define a cavity between the MEMS wafer and the cap. The outgas barrier layer is arranged to prevent or limit outgas sing of gas from the semiconductor wafer to the cavity. This can help improve the consistency of the resultant IC over its lifetime, relative to conventional approaches.

Figure 3:
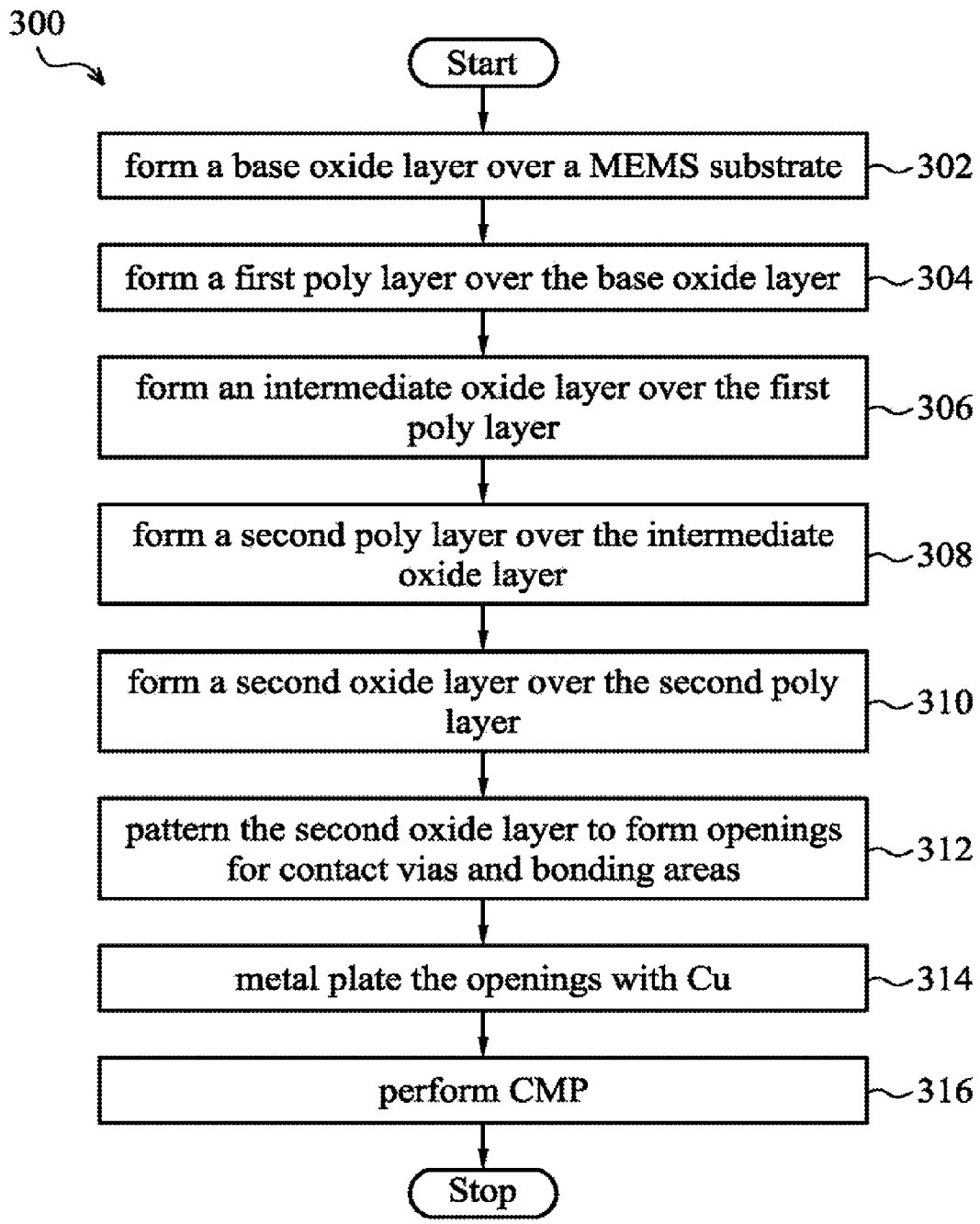
FIG. 3 illustrates a flow diagram of some embodiments of a method for forming a MEMS wafer according to the present disclosure.

FIG. 3 illustrates a flow diagram of some embodiments of a method 300 for forming a MEMS wafer according to the present disclosure. While disclosed method 300 (and other methods described herein) is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, a base oxide layer is formed over a MEMS wafer. In some embodiments, the MEMs substrate comprises Si.

At 304, a first poly layer is formed over the base oxide layer. The first poly layer acts as the electrode layer of the MEMS wafer which enables measurement of electrical characteristics of the MEMS wafer.

At 306, an intermediate oxide layer is formed over the first poly layer. This oxide layer provides electrical isolation between the first poly layer and other conductive layers that are formed at a later stage. Further, this oxide layer is annealed at a high temperature (>900° C.) to reduce outgas sing from this layer. An anneal performed at this point will not create any electrical or mechanical problems because no temperature sensitive components are integrated with the MEMS device at this point. Thus, because the MEMS wafer does not include active devices, which include doped regions, there is little or no risk that this anneal will cause thermal budget issues for channel regions or other implanted regions that would tend to diffuse during a high temperature anneal.

At 308, a second poly layer is formed over the intermediate oxide layer. The second poly layer acts as the outgas barrier layer. The area of the second poly layer is chosen such that, it provides enough protection and coverage from the devices and substrates that are integrated with the MEMS device at later processing stages. In other embodiments, metal layers could also be used as the outgas barrier layer.

At 310, a second oxide layer is formed over the second poly layer. The second oxide layer is annealed at a high temperature (>900° C.) to reduce outgassing from this layer. In some embodiments, this second oxide layer has a density that is greater than a density of the first oxide layer. Although this can be more expensive or time-consuming in some cases, it can also be advantageous in that providing the second oxide layer with a higher density can help to mitigate the second oxide layer acting as an outgassing source.

At 312, the second oxide layer is patterned to form openings for contact vias and bonding areas.

At 314, the openings are metal plated/deposited with copper (Cu).

At 316, CMP (chemical mechanical polishing) is performed over the deposited Cu. Thus, a smooth, flat surface is provided, which will be suitable for direct bonding to a MEMS wafer.

FIGS. 4A-4H illustrate embodiments of cross sectional images of the method 300 for formation of a MEMS wafer according to the present disclosure.

Figure 4A:
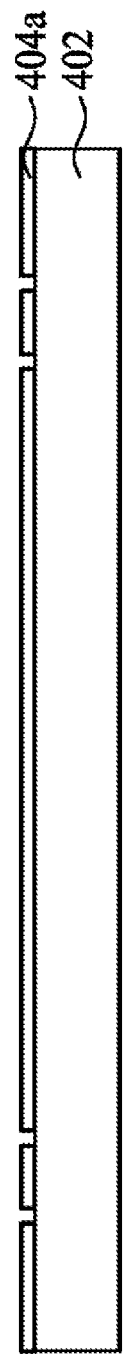

FIG. 4A illustrates a cross sectional image of a semiconductor body 400a having a patterned base oxide layer 404a over a substrate 402.

The substrate 402 can be a bulk silicon substrate, a silicon on insulator (SOI) substrate, a binary semiconductor substrate (e.g., GaAs), tertiary semiconductor substrate (e.g., AlGaAs), or higher order semiconductor substrates. Any of these substrates can include doped regions formed in the substrate, one or more insulating layers formed in or on the substrate, and/or conducting layers formed in or on the substrate. The base oxide layer is patterned for forming contact electrodes.

Figure 4B:
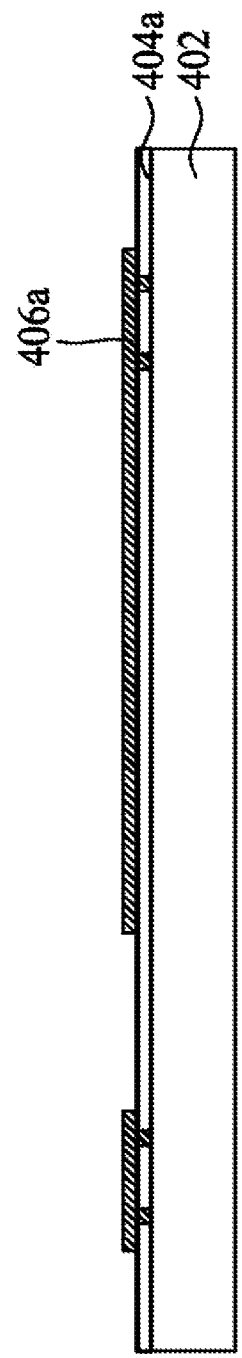

FIG. 4B illustrates a cross sectional image of a semiconductor body 400b having a patterned first poly layer 406a over the base oxide layer 404a. This poly layer 406a layer forms the electrode of the MEMS wafer. In other embodiments, the first poly layer 406a could also be another conductive material, such as a metal for example.

Figure 4C:
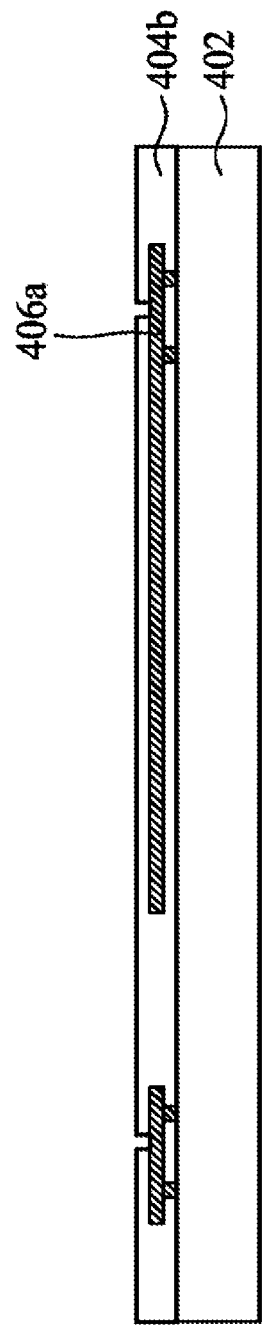

FIG. 4C illustrates a cross sectional image of a semiconductor body 400c after forming an intermediate oxide layer 404b over the first poly layer 406a. After deposition of the intermediate oxide layer 404b, CMP is performed on it, to form a planar top surface. Further, the intermediate oxide layer 404b is patterned to create via openings for interconnections to the first poly layer 406a. The oxide layers 404a and 404b are annealed at a high temperature (>900° C.) for reducing outgassing. At this point, high temperature annealing is safe since there is no semiconductor wafer underlying the MEMS substrate 402.

Figure 4D:
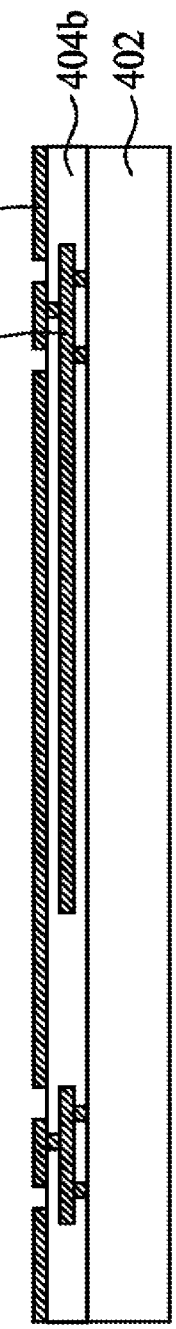

FIG. 4D illustrates a cross sectional image of a semiconductor body 400d after forming a patterned second poly layer 406b over the intermediate oxide layer 404b. This poly layer 406b acts as an outgas sing block and electrical shield of the MEMS wafer from any other wafer that gets integrated with the MEMS wafer.

Figure 4E:
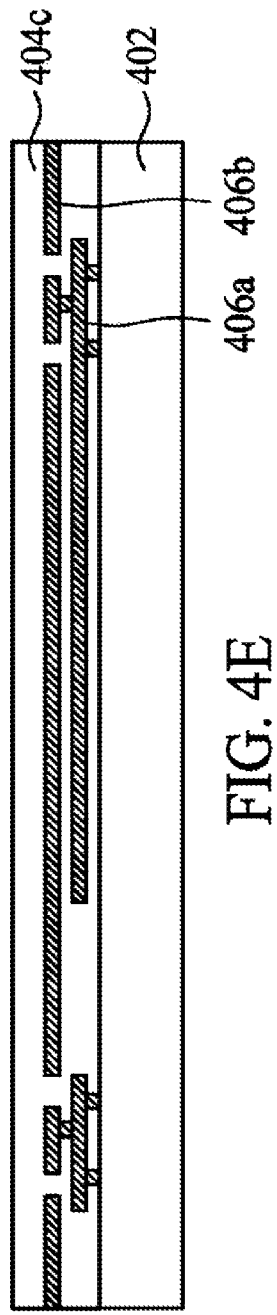

FIG. 4E illustrates a cross sectional image of a semiconductor body 400e after forming a second oxide layer 404c over the second poly layer 406b. Following deposition of the second oxide layer 404c, CMP is performed to planarize the top surface of the second oxide layer 404c.

Figure 4F:
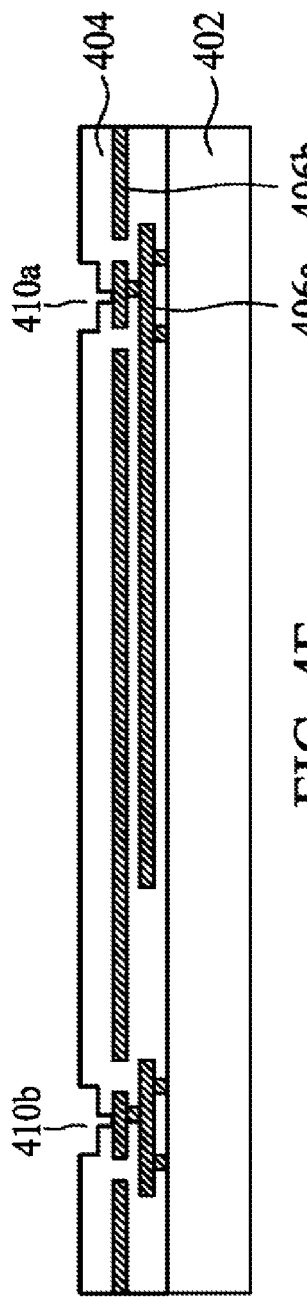

FIG. 4F illustrates a cross sectional image of a semiconductor body 400f after patterning the second oxide layer 404c to create openings 410a and 410b for contact vias and bonding areas. This image illustrates the start of a Cu damascene process. The oxide layers are annealed at a high temperature (>900° C.) for reducing outgassing.

FIG. 4G illustrates a cross sectional image of a semiconductor body 400g after depositing a metal layer 412 over the oxide layer 404. In some embodiments, the metal layer comprises Cu.

FIG. 4H illustrates a cross sectional image of a semiconductor body 400h after performing CMP over the metal layer 412. This will lead to formation of patterned conductors/contact pads 412a and 412b embedded in the MEMS wafer having top surfaces that are co-planar with the top surface of the dense oxide layer 404. The MEMS wafer at this stage of processing is represented by reference numeral 413.

Figure 5:
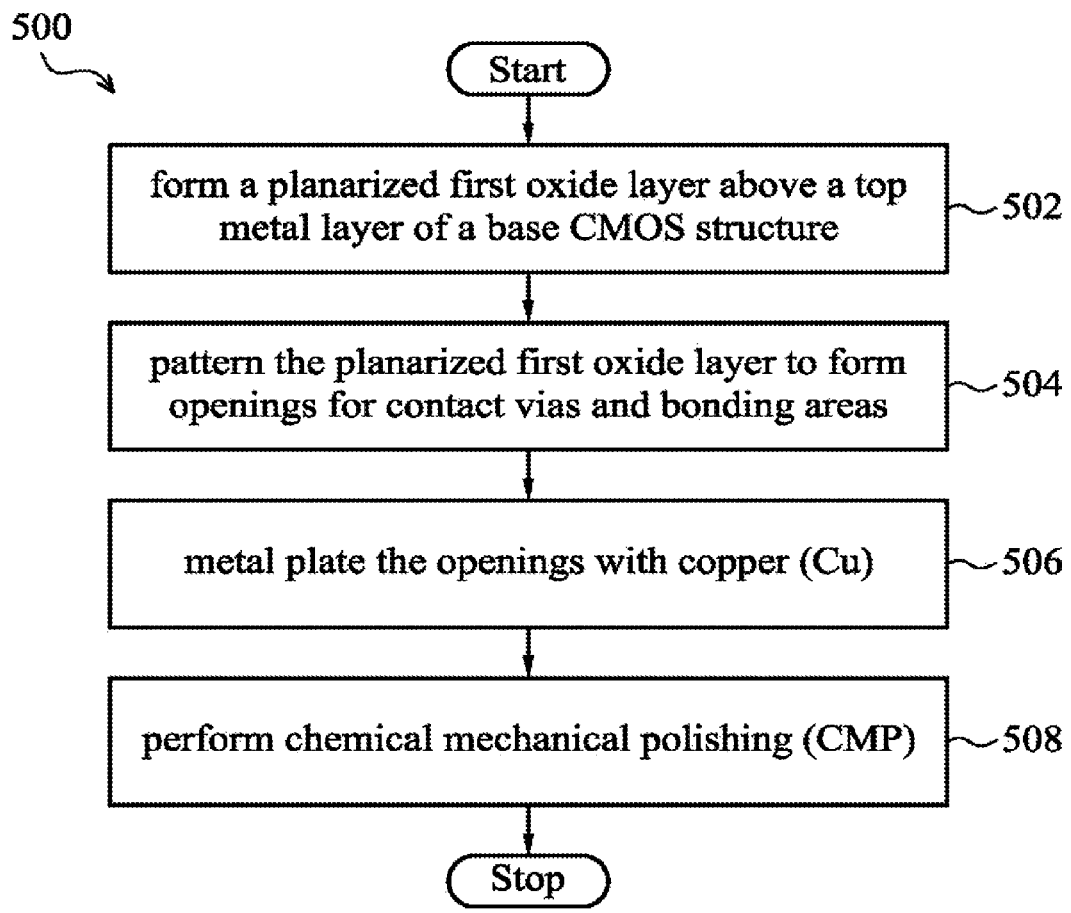
FIG. 5 illustrates a flow diagram of some embodiments of a method for forming a CMOS wafer according to the present disclosure.

FIG. 5 illustrates a flow diagram of some embodiments of a method 500 for forming a CMOS wafer according to the present disclosure.

At 502, a planarized first oxide layer is formed above a top metal layer of a base CMOS structure.

At 504, the planarized first oxide layer is patterned to form openings for contact vias and bonding areas.

At 506, the openings are metal plated with Cu.

At 508, CMP is performed over the metal layer to form patterned conductors.

FIGS. 6A-6D illustrate embodiments of cross sectional images of the method 500 for formation of a CMOS wafer according to the present disclosure.

FIG. 6A illustrates a cross sectional image of a semiconductor body 600a having a planarized first oxide layer 610 over a top metal layer 608 of a base CMOS structure 602. The first oxide layer is planarized using CMP process. The CMOS wafer further comprises metal structures 606 and contact vias 604 embedded within the first oxide layer 610.

FIG. 6B illustrates a cross sectional image of a semiconductor body 600b after patterning the top surface of the first oxide layer 610 to create openings 612a and 612b for contact vias and bonding areas. This image illustrates the start of a Cu damascene process.

FIG. 6C illustrates a cross sectional image of a semiconductor body 600c after depositing a metal layer 614 over the oxide layer 610. In some embodiments, the metal layer comprises Cu.

FIG. 6D illustrates a cross sectional image of a semiconductor body 600d after performing CMP over the metal layer 614 to form patterned metal conductors 614a and 614b having top surfaces that are coplanar with the top surface of the first oxide layer 610. The CMOS wafer at this stage of processing is represented by reference numeral 615.

FIGS. 7A-7F illustrate embodiments of cross sectional images of a method of formation of a wafer package system according to the present disclosure.

Figure 7A:
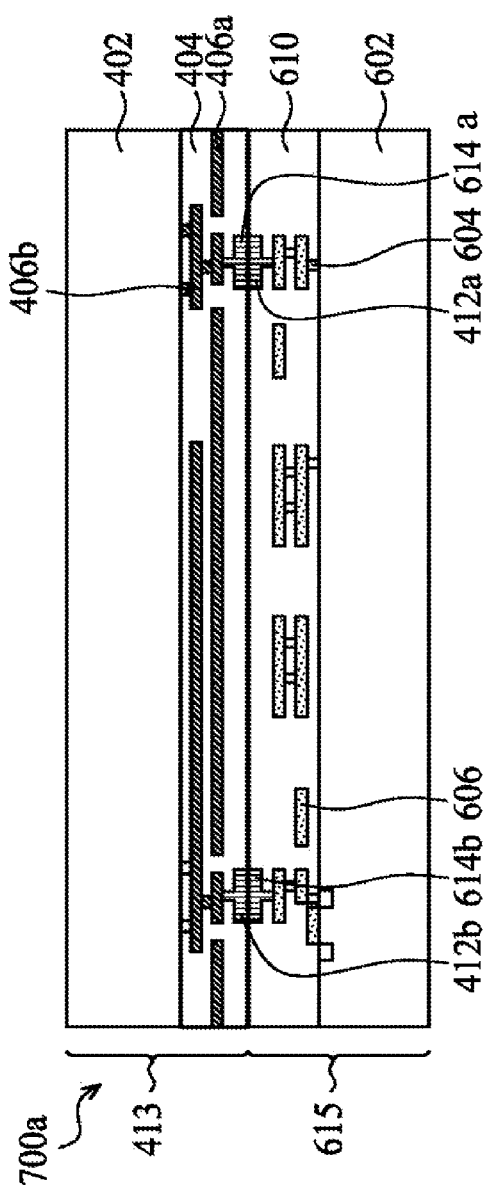
FIGS. 7A-7F illustrate embodiments of cross sectional images of a method of formation of a wafer package system according to the present disclosure.

FIG. 7A illustrates a cross sectional image of a semiconductor body 700a where, MEMS wafer 413 is flipped and disposed over CMOS wafer 615 in such a way that the patterned contact pads/contact electrodes 412a and 412b align with patterned conductors/contact electrodes 614a and 614b respectively. This form of conjoining between the two wafers presents a wafer bonding technique called direct bonding or hybrid bonding, where a damascene-patterned metal segment provides inter layer electrical connection via Cu—Cu bonding and a fusion bond between the oxide layers of the two wafers provide mechanical support to the two wafers. After the MEMS wafer 413 is disposed over the CMOS wafer 615 a 400° C. anneal is carried out so that the metal grains of patterned conductors grows and re-connects through a metal fusion bond. This leads to a strong and stable electrical connection between the two wafers without requiring an epoxy or adhesive layer, or even a separate solder layer between the two wafers.

Figure 7B:
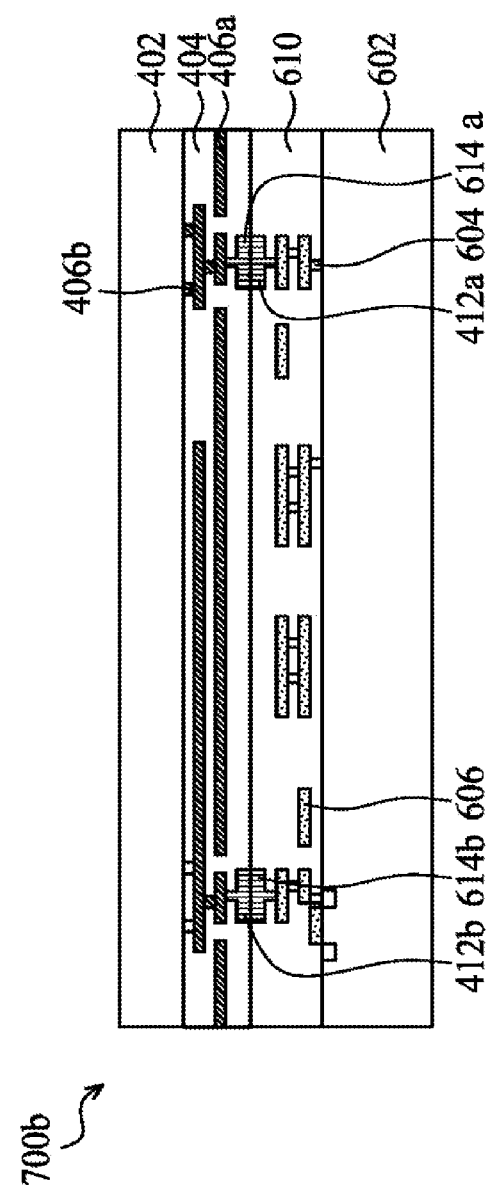

FIG. 7B illustrates a cross sectional image of a semiconductor body 700b after performing grinding and/or CMP to thin down the MEMS substrate 402 to desired thickness. In some embodiments, the MEMS substrate thickness ranges approximately between 10 um and 60 um.

Figure 7C:
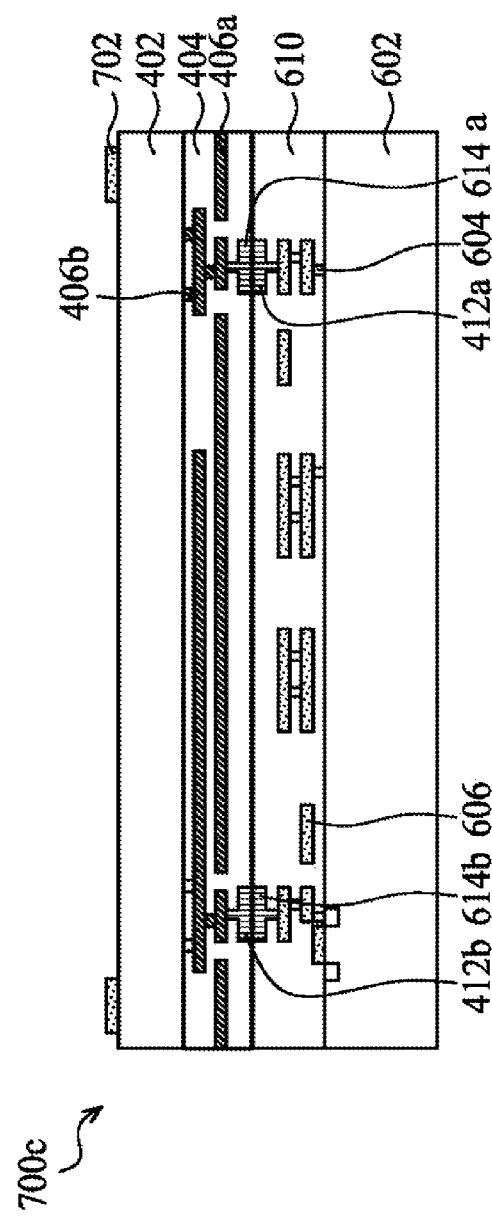

FIG. 7C illustrates a cross sectional image of a semiconductor body 700c after forming bonding contacts, represented individually by reference numeral 702, on a back surface of the MEMS substrate 402. In some embodiments, the bonding contact 702 comprises AlCu or Au.

Figure 7D:
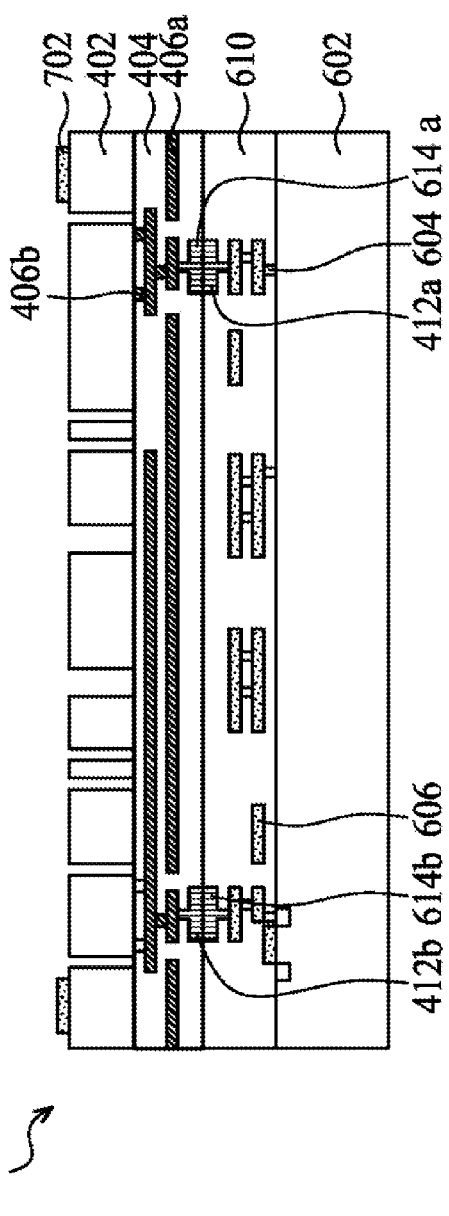

FIG. 7D illustrates a cross sectional image of a semiconductor body 700d after patterning the MEMS substrate 402. MEMS wafer. This process step defines the main structures of MEMS devices, including proof mass, springs, anchors, and etc. In some embodiments, a deep reactive ion etching (DRIE) method is used for patterning the MEMS substrate 402.

Figure 7E:
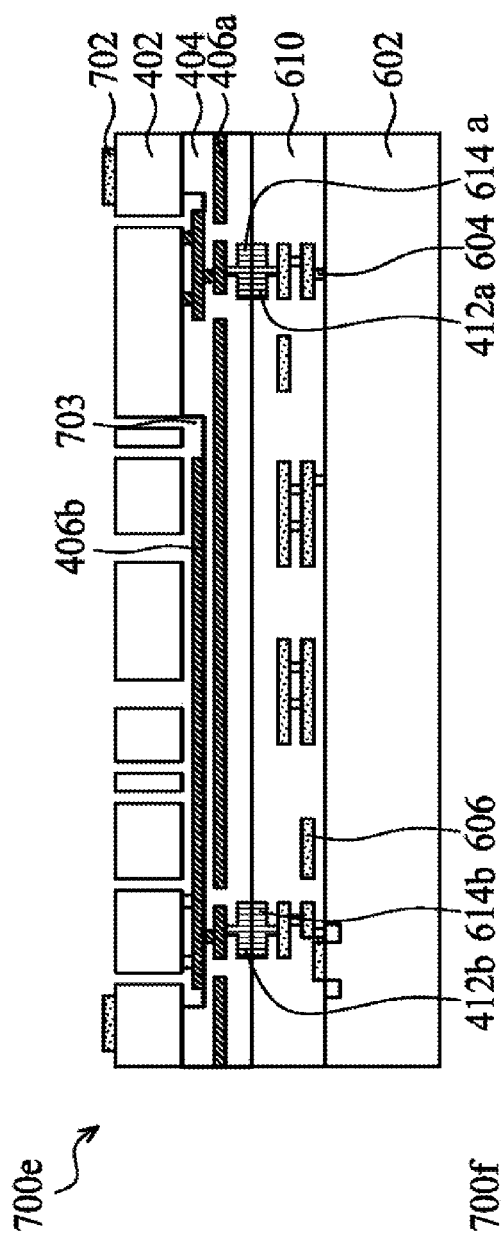

FIG. 7E illustrates a cross sectional image of a semiconductor body 700e after performing a VHF etching to remove portions of dense oxide 404 and create sacrificial openings 703, to form release structures needed for MEMS sensing. VHF etching helps in releasing microstructures without stiction issue. At this stage, a quick probing can be performed to test the functioning of the sensor/integrated circuit.

Figure 7F:
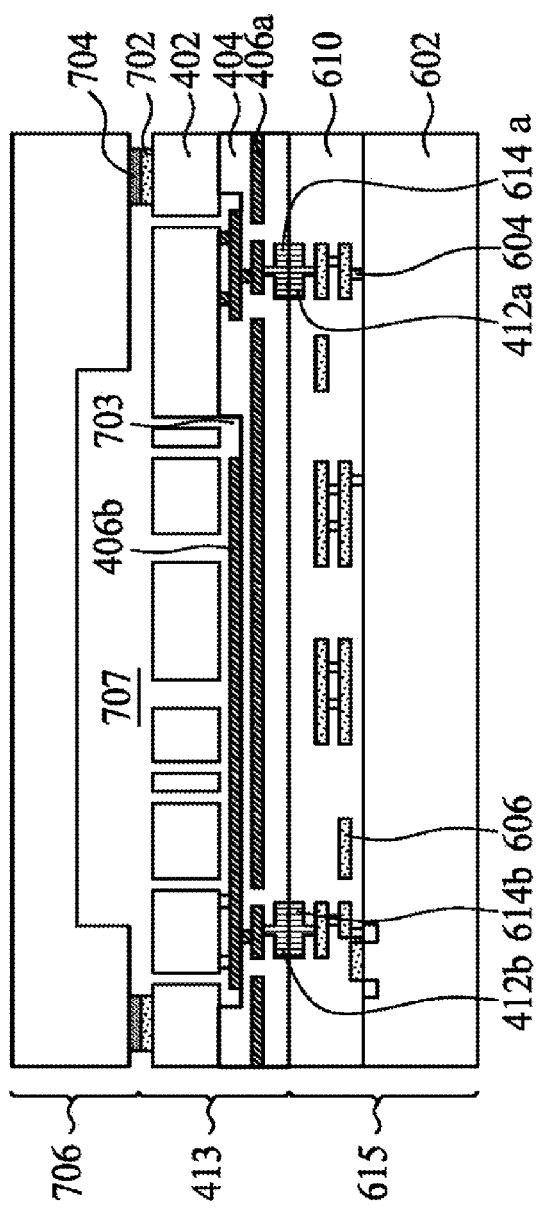

FIG. 7F illustrates a cross sectional image of a semiconductor body 700f after bonding a cap wafer 706 over the MEMS wafer creating a cavity 707 between the MEMS wafer 413 and the cap wafer 706. The cap wafer 706 has bonding contacts, represented individually by reference numeral 704, that form a fusion or eutectic bond with the bonding contacts 702. These bonding processes play an important role in deciding the pressure level of a cavity that is formed between the MEMS wafer and a cap wafer. After formation of the semiconductor body 700f, it undergoes some backend process where the wafer package is sliced to form individual dies. In some embodiments, the pressure level of the cavity 707 ranges between approximately 0.1 Torr and 10 Torr. In some embodiments, the bonding contact 704 comprises Ge or Au.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

The present disclosure relates to a structure and processing method for forming a MEMS die package system, that can prevent outgas sing from devices and materials integrated with the MEMS die. An outgas barrier layer which has an area same as the area of the underlying die is formed within the MEMS die for this purpose. In an embodiment of a MEMS-CMOS integrated system, a MEMS-last or post-CMOS integration technique is utilized, where the metallization fabrication and formation of poly-silicon mircrostructures are completed separately on the CMOS and MEMS dies respectively. A Cu damascene process is utilized to form patterned conductors on both the MEMS die and the CMOS die and the MEMS die is flipped and bonded with the CMOS die using direct bonding. This enables a stable electrical resistance interface between the two dies. Also, a VHF etching technique is utilized to release microstructures on the MEMS die which avoids process stiction issues. In some embodiments, back end processes are performed comprising dicing the wafer package to form individual dies.

In some embodiments, the present disclosure relates to an integrated circuit (IC) comprising a semiconductor die comprising a first top surface and a first bottom surface, a MEMS die comprising a second top surface and a second bottom surface, wherein the MEMS die is disposed over the semiconductor die, and the first top surface is coupled to the second top surface, a cap bonded to the second bottom surface defining a cavity between the MEMS die and the cap, and an outgas barrier layer disposed within the MEMS die configured to prevent outgassing from the semiconductor die to the cavity.

In another embodiment, the present disclosure relates to an integrated circuit (IC) comprising, a semiconductor die comprising a semiconductor interconnect overlying a semiconductor substrate, wherein the semiconductor interconnect comprises a first oxide layer and two patterned conductors that are co-planar, and form a top surface of the semiconductor interconnect, a MEMS die comprising a MEMS interconnect overlying a MEMS substrate, wherein the MEMS interconnect includes a second oxide layer and two patterned MEMS conductors that are co-planar and form a top surface of the MEMS interconnect, wherein, the MEMS die is disposed over the semiconductor die, and the top surface of the MEMS interconnect abuts the top surface of the semiconductor interconnect, aligning the patterned MEMS conductors with the patterned conductors of the semiconductor die, the MEMS die is coupled to the semiconductor die through a direct bond, a cap bonded to a bottom surface of the MEMS substrate, defining a cavity between the MEMS die and the cap, and an outgas barrier layer disposed within the MEMS interconnect, configured to prevent outgassing from the semiconductor die to the cavity.

In yet another embodiment, the present disclosure relates to a method of forming an integrated circuit (IC) of a sensor device, comprising, forming a semiconductor wafer comprising a planar first top surface and a first bottom surface, forming a MEMS wafer comprising a planar second top surface and a second bottom surface, wherein an outgas barrier layer is disposed within the MEMS wafer, bonding the first top surface to the second top surface, and bonding a cap wafer over the second bottom surface, to define a cavity between the MEMS wafer and the cap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated circuit (IC) comprising:
a semiconductor die comprising a first top surface and a first bottom surface;
a MEMS (micro-electromechanical system) die comprising a second top surface and a second bottom surface, wherein the MEMS die is disposed over the semiconductor die, and the first top surface is coupled to the second top surface;
a cap bonded to the second bottom surface defining a cavity between the MEMS die and the cap; and
an outgas barrier layer disposed within the MEMS die configured to prevent outgassing from the semiconductor die to the cavity;
wherein the MEMS die comprises:
a MEMS substrate and a MEMS interconnect;
patterned conductors disposed within an oxide layer of the MEMS interconnect, and wherein the outgas barrier layer is disposed between the MEMS substrate and the oxide layer; and
an electrode layer formed between the outgas barrier layer and the MEMS substrate.

2. The IC of claim 1, wherein the first top surface of the semiconductor die comprises an oxide layer separating two patterned conductors.

3. The IC of claim 1, wherein the outgas barrier layer comprises polysilicon or a metal.

4. The IC of claim 1, wherein the MEMS die is bonded to the semiconductor die through direct bonding between patterned conductors on the first top surface and patterned conductors on the second top surface.

5. The IC of claim 4, wherein the patterned conductors on the first top surface and the second top surface comprise Cu (copper).

6. The IC of claim 1,
wherein the patterned conductors and oxide layer have co-planar surfaces that collectively define the second top surface.

7. The IC of claim 1, wherein the cap is bonded with the MEMS die through a eutectic bond or a fusion bond.

8. The IC of claim 1, wherein the semiconductor die comprises a CMOS (complementary metal oxide semiconductor) die.

9. An integrated circuit (IC) comprising:
a semiconductor die comprising a semiconductor interconnect overlying a semiconductor substrate, wherein the semiconductor interconnect comprises a first oxide layer and two patterned conductors which are co-planar and which form a top surface of the semiconductor interconnect;
a MEMS (micro-electromechanical system) die comprising a MEMS interconnect overlying a MEMS substrate, wherein the MEMS interconnect includes a second oxide layer and two patterned MEMS conductors that are co-planar and form a top surface of the MEMS interconnect, wherein:
the MEMS die is disposed over the semiconductor die, and the top surface of the MEMS interconnect abuts the top surface of the semiconductor interconnect, aligning the two patterned MEMS conductors with the two patterned conductors of the semiconductor die;
the MEMS die is coupled to the semiconductor die through a direct bond;
a cap bonded to a bottom surface of the MEMS substrate, defining a cavity between the MEMS die and the cap;
an outgas barrier layer disposed between the MEMS substrate and the second oxide layer, configured to prevent outgassing from the semiconductor die to the cavity; and
an electrode layer formed between the outgas barrier layer and the MEMS substrate.

10. The IC of claim 9, wherein the outgas barrier layer comprises poly silicon or a metal.

11. The IC of claim 9, wherein an area of the outgas barrier layer is the same as an area of the semiconductor die.

12. The IC of claim 9, wherein the electrode layer comprises poly silicon or a metal.

13. The IC of claim 9, wherein the semiconductor die comprises a CMOS (complementary metal oxide semiconductor) die.

14. An integrated circuit (IC) comprising:
a CMOS (complementary metal oxide semiconductor) die comprising a CMOS semiconductor substrate with CMOS devices in or on the CMOS semiconductor substrate and a CMOS interconnect structure made up of metal lines and vias that couple the CMOS devices to one another, wherein a top surface of the CMOS die corresponds to an uppermost surface of the CMOS interconnect structure and a bottom surface of the CMOS die corresponds to a bottom surface of the CMOS semiconductor substrate;
a MEMS (micro-electromechanical system) die comprising a MEMS semiconductor substrate including a MEMS device and a MEMS interconnect structure made of metal lines and vias electrically coupled to the MEMS device, wherein a top surface of the MEMS die corresponds to an uppermost surface of the MEMS interconnect structure and a bottom surface of the MEMS die corresponds to a bottom surface of the MEMS semiconductor substrate, the top surface of the MEMS die being in direct physical and electrical contact with the top surface of the CMOS die; and
a cap bonded to the bottom surface of the MEMS die and defining a cavity between the MEMS die and the cap, wherein the cavity is hermetically sealed from an ambient environment around the IC;
wherein the MEMS interconnect structure includes an outgas barrier layer configured to prevent outgassing, which is generated by the CMOS interconnect structure, from reaching the cavity;
wherein the MEMS device includes a proof mass surrounded on multiple sides by anchors and by springs which moveably couple the proof mass to the anchors, and wherein the outgas barrier layer comprises a continuous sheet of polysilicon or metal that extends continuously over the proof mass, the springs, and the anchors.

15. The IC of claim 14, wherein the MEMS die further comprises:
a conductive electrode lining an inner surface of the cavity between the proof mass and the MEMS interconnect structure; and
an oxide separating the conductive electrode from the outgas barrier layer in the MEMS interconnect structure.

16. The IC of claim 14, wherein the outgas barrier layer is encapsulated by oxide and is electrically isolated from the metal lines and the vias of the MEMS interconnect structure.

17. The IC of claim 14, wherein the top surface of the CMOS die comprises a first set of patterned conductors laterally separated by a first oxide.

18. The IC of claim 17, wherein the top surface of the MEMS die comprises a second set of patterned conductors laterally separated by a second oxide.

19. The IC of claim 18, wherein the first set of patterned conductors correspond to the second set of patterned conductors so as to form a direct electrical connection between the MEMS die and CMOS die.

\* \* \* \* \*